(12) United States Patent
Su et al.

(10) Patent No.: US 9,577,077 B2
(45) Date of Patent: *Feb. 21, 2017

(54) WELL CONTROLLED CONDUCTIVE DOT SIZE IN FLASH MEMORY

(71) Applicant: Taiwan Semiconductor Manufacturing Co., Ltd., Hsin-Chu (TW)

(72) Inventors: Tsu-Hui Su, Taipei (TW); Chih-Ming Chen, Hsinchu (TW); Szu-Yu Wang, Hsinchu (TW); Chung-Yi Yu, Hsin-Chu (TW); Chia-Shiung Tsai, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/308,808

(22) Filed: Jun. 19, 2014

(65) Prior Publication Data

US 2015/0371994 A1    Dec. 24, 2015

Related U.S. Application Data

(63) Continuation-in-part of application No. 14/261,539, filed on Apr. 25, 2014.

(51) Int. Cl.
| | |
|---|---|
| *H01L 27/115* | (2006.01) |
| *H01L 29/66* | (2006.01) |
| *H01L 29/792* | (2006.01) |
| *H01L 21/28* | (2006.01) |
| *H01L 29/423* | (2006.01) |
| *H01L 29/788* | (2006.01) |

(52) U.S. Cl.
CPC .. *H01L 29/66833* (2013.01); *H01L 21/28273* (2013.01); *H01L 21/28282* (2013.01); *H01L 29/4234* (2013.01); *H01L 29/42324* (2013.01); *H01L 29/66825* (2013.01); *H01L 29/7881* (2013.01); *H01L 29/792* (2013.01)

(58) Field of Classification Search
CPC ......... H01L 29/66833; H01L 21/28273; H01L 21/28282; H01L 29/42324; H01L 29/4234
USPC .................. 438/257–267; 257/298, 314–326
See application file for complete search history.

(56) References Cited

U.S. PATENT DOCUMENTS

| | | | |
|---|---|---|---|
| 5,852,306 | A | 12/1998 | Forbes |
| 6,774,061 | B2 | 8/2004 | Coffa et al. |
| 7,101,760 | B1 | 9/2006 | Lojek |

(Continued)

OTHER PUBLICATIONS

Non-Final Office Action dated Jul. 10, 2015 in connection with U.S. Appl. No. 14/261,539.

(Continued)

*Primary Examiner* — Ori Nadav
(74) *Attorney, Agent, or Firm* — Eschweiler & Associates, LLC

(57) ABSTRACT

Some embodiments of the present disclosure relate to a method for forming flash memory. In this method, a first tunnel oxide is formed over a semiconductor substrate. A self-assembled monolayer (SAM) is then formed on the first tunnel oxide. The SAM includes spherical or spherical-like crystalline silicon dots having respective diameters which are less than approximately 30 nm. A second tunnel oxide is then formed over the SAM.

23 Claims, 13 Drawing Sheets

(56) References Cited

U.S. PATENT DOCUMENTS

| | | | |
|---|---|---|---|
| 7,579,646 | B2 | 8/2009 | Wang et al. |
| 2002/0140022 | A1 | 10/2002 | Lin et al. |
| 2003/0075756 | A1 | 4/2003 | Suzuki |
| 2006/0046383 | A1 | 3/2006 | Chen et al. |
| 2006/0251561 | A1 | 11/2006 | Farrell et al. |
| 2007/0145468 | A1 | 6/2007 | Majumdar et al. |
| 2008/0121966 | A1 | 5/2008 | Muralidhar et al. |
| 2009/0039407 | A1 | 2/2009 | Vora |
| 2010/0155909 | A1 | 6/2010 | Ramappa et al. |
| 2011/0263129 | A1 | 10/2011 | Shin et al. |
| 2012/0267616 | A1 | 10/2012 | Jang et al. |
| 2012/0267699 | A1 | 10/2012 | Kiyotoshi |
| 2012/0292683 | A1* | 11/2012 | Loiko ............... H01L 29/42332 257/316 |
| 2013/0207053 | A1* | 8/2013 | Gonen Williams ....... C30B 7/14 252/519.3 |
| 2013/0207174 | A1 | 8/2013 | Wang et al. |

OTHER PUBLICATIONS

Crippa, et al. "Nonvolatile Memories: NOR vs. NAND Architectures." Memories in Wireless Systems, Springer-Verlag Berlin Heidelberg, 2008.

Li, et al. "Fabrication and Properties of Nano-Si Quantum Dot Flash Memory." Solid-State and Integrated Circuit Technology, 2006. ICSICT '06. 8th International Conference. Oct. 2006.

Muralidhar, et al. "A 6V Embedded 90nm Silicon Nanocrystal Nonvolatile Memory." Electron Devices Meeting, 2003. IEDM '03 Technical Digest. IEEE International. Dec. 2003.

www.semiconductor-today.com "Flash Fast Forward to Quantum Dot Memory." Semiconductor Today—Compounds and Advanced Silicon, vol. 3, Issue 5, Jun. 2008.

Chang, Ko Min. "SG-TFS: a Versatile Embedded Flash with Silicon Nanocrystals as the Storage Medium." Solid-State and Integrated-Circuit Technology, 2008. ICSICT 2008. 9th International Conference. Oct. 2008.

U.S. Appl. No. 14/489,902, filed Sep. 18, 2014.

Non Final Office Action Dated Sep. 25, 2015 U.S. Appl. No. 14/489,902.

Wang, et al. "Efficient One-Pot Synthesis of Highly Photoluminescent Alkyl-Functionalised Silicon Nanocrystals." Chem, Commun., 2011, 47, 4941-4943. Published in 2011.

Wang, et al. "A General Strategy for Nanocrystal Synthesis." Nature. vol. 437, Sep. 1, 2005, doi:10.1038/nature03968.

Bigioni, et al. "Kinetically Driven Self Assembly of Highly Ordered Nanoparticlemonolayers." Nature Materials, vol. 5, Apr. 2006.

Sletnes, et al. "Octoxy Capped Si Nanoparticles Synthesized by Homogeneous Reduction of SiCl4 with Crown Ether Alkalide." Royal Society of Chemistry, Dalton Trans., 2014, 43, 2127. Published in 2014.

P. Chakraborty, et al.; "Nanocrystal Non-Volatile Flash Memory Devices: A Simulation Study"; IETE Mumbai Centre Electronics and ECE Department, Kharagpur, India; 2007; p. D-46-D-50.

U.S. Appl. No. 14/261,539, filed Apr. 25, 2014.

Jan Schmidt, et al.; "Surface Passivation of Silicon Solar Cells Using Plasma—Enhanced Chemical—Vapour—Deposited SiN Films and Thin Thermal SiO2/Plasma SiN Stacks"; Semiconductor Science and Technology; 2001; p. 164-170.

John Phelan; "Investigating the Influence of Interface and Vacancy Defects on the Growth of Silicon Quantum Dots in SiO2"; The School of Graduate and Postdoctoral Studies, The University of Western Ontario; 2013; p. 1-53.

U.S. Appl. No. 14/583,291, filed Dec. 26, 2014.

Final Office Action Dated Oct. 22, 2015 U.S. Appl. No. 14/261,539.

Non Final Office Action Dated Apr. 21, 2016 U.S. Appl. No. 14/583,291.

Notice of Allowance Dated Mar. 21, 2016 U.S. Appl. No. 14/489,902.

Final Office Action Dated Jul. 29, 2016 U.S. Appl. No. 14/583,291.

* cited by examiner

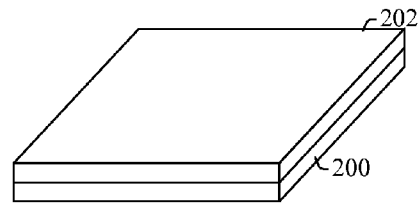
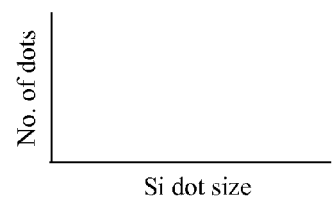
Fig. 2A
Fig. 2B
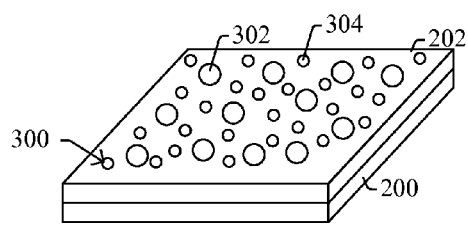
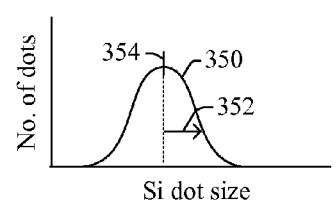
Fig. 3A
Fig. 3B
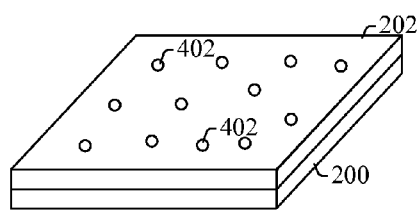
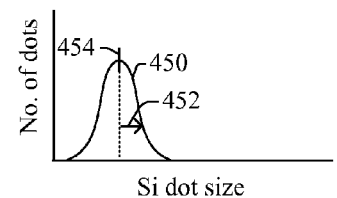
Fig. 4A
Fig. 4B
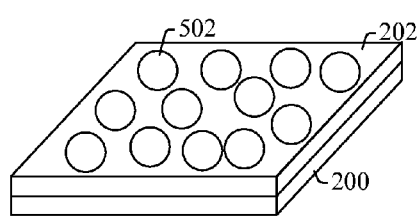
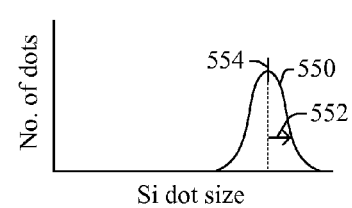
Fig. 5A
Fig. 5B

WELL CONTROLLED CONDUCTIVE DOT SIZE IN FLASH MEMORY

RELATED APPLICATIONS

This application is a continuation-in-part application which claims priority to U.S. application Ser. No. 14/261,539 filed on Apr. 25, 2014 and entitled, "UNIFORMITY CONTROL FOR SI DOT SIZE IN FLASH MEMORY"; the contents of which are incorporated herewith in their entirety.

BACKGROUND

Flash memory is used in a wide variety of electronic applications. Some flash memory cells utilize a floating gate field-effect transistor (FET), which stores one or more bits of data in the form of an electric charge within a "floating" gate. The floating gate resides above a channel of, and below a control gate of, the FET, but is electrically-isolated from both by an oxide layer. The memory cell stores charge when the FET is in an "on" state (i.e., when current flows between the source and drain) by applying a voltage to the control gate, which causes electrons to tunnel from the channel into the floating gate. Because the floating gate is electrically-isolated from the channel and the control gate, electrons that tunnel into it will remain there indefinitely.

Electric charge trapped within the floating gate screens the electric field from the control gate within the channel, which selectively changes the threshold voltage ($V_t$) of the FET. For flash memory devices that use an array of memory cells, the stored data can be read out of the array by measuring which cells have a higher $V_t$ (e.g., store a "1") and which have a lower $V_t$ (e.g., store a "0"). Multi-bit cells are also possible, where a single memory cell has more than two discrete $V_t$ states corresponding to more than two data states.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-5A illustrate a series of perspective views that collectively depict an embodiment consistent with FIG. 1's methodology.

FIGS. 2B-5B illustrate charts depicting size distributions for Si dots for the perspective views of FIGS. 2A-5A, respectively.

FIGS. 16-23 depict a series of cross-sectional views that collectively illustrate a method of providing a charge trapping layer that includes Si dots in accordance with some embodiments consistent with FIG. 15.

DETAILED DESCRIPTION

Figure 1:
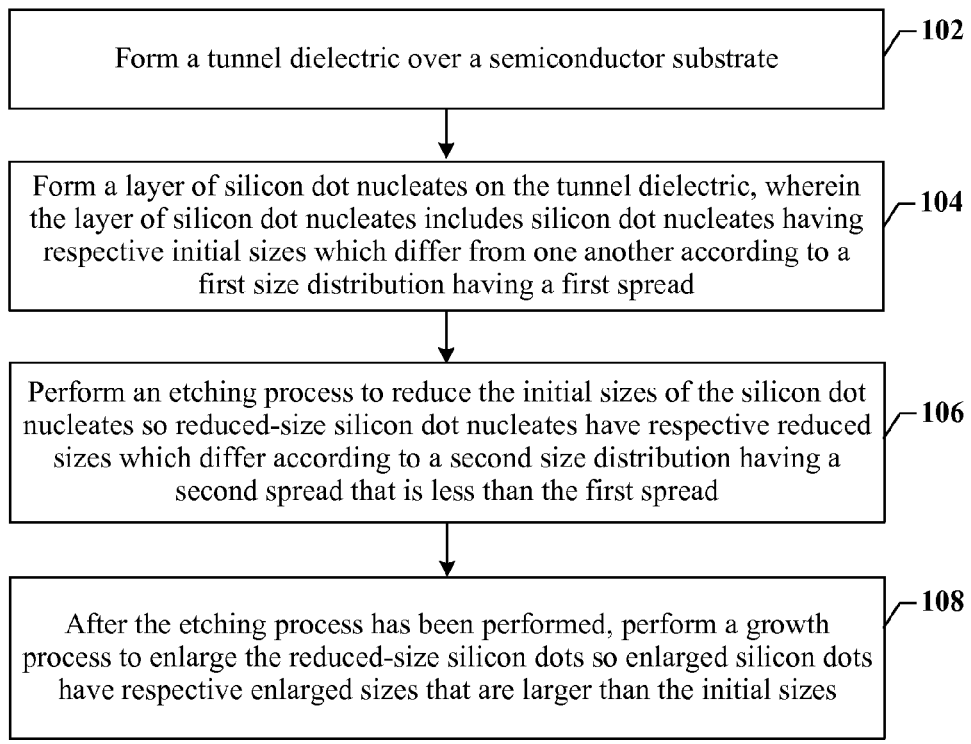
FIG. 1 illustrates a flow chart depicting a method of providing a charge trapping dielectric layer that includes Si dots in accordance with some embodiments.

The following disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Although some flash memories use floating gates, other flash memories use charge trapping layers to control the $V_t$ of a given flash memory cell. These charge trapping layers operate in largely the same basic manner as conductive gate electrodes, except that charge trapping layers do not need to be conductive. For example, one type of charge trapping layer is a nitride layer, sandwiched between two oxide layers (i.e., an oxide-nitride-oxide (ONO) charge trapping layer), while another type of charge trapping layer is a layer of silicon dots which are sometimes referred to as silicon nanocrystals. Charge, in the form of electrons or holes, can become selectively trapped on (or selectively stripped from) the layer of silicon dots based on the bias conditions applied to the flash memory cell. Ideally, for each flash memory cell, the layer of silicon dots would store the same discrete charge levels for respective programmed data states. However, because the individual silicon dots have sizes that vary, sometimes widely, from one another, some cells have a tendency to store charge more easily while other cells tend to be more difficult to trap charge on. Hence, even when the same bias conditions are applied to flash cells with Si dots as a charge-trapping layer, the $V_t$s of the flash memory cells can vary due to size variations of Si dots. Therefore, it would be desirable to produce a flash memory device that includes a layer of silicon dots that collectively exhibit a relatively uniform size distribution across the silicon dots.

FIG. 1 shows a method for forming a layer of silicon dots with a relatively uniform size distribution in accordance with some embodiments. At 102, a tunnel oxide is formed over a semiconductor substrate. At 104, a layer of silicon dot nucleates are formed on the tunnel oxide. The silicon dot nucleates have respective initial sizes which differ from one another according to a first size distribution. At 106, an etching process in carried out to reduce the initial sizes of the silicon dot nucleates. These reduced-size silicon dot nucleates have respective reduced sizes which differ from one another according to a second size distribution, which has a smaller spread than the first size distribution. In 108, after the etching process has been performed, a growth process is performed to enlarge the reduced sizes of the reduced-size silicon dots so enlarged silicon dots have respective enlarged sizes that are larger than the initial sizes. Due to the use of the etching process 106, which "tightens" the size distribution of the Si dots, this growth process 108 results in flash memory cells with enlarged Si dots that are relatively uniform in size. Hence, compared to previous approached, the resultant layer of Si dots exhibits more uniform charge trapping capabilities and, consequently, more uniform threshold voltage state variation for the memory cells. For example, large variations in Si dot size can cause a corresponding variation in charge trapping ability and threshold voltage variation. By providing silicon dots with more uniform sizes (i.e., lower variation in silicon dot size), the present disclosure allows the flash memory cells to operate at lower voltages for a given number of data states, have more data states for a given memory cell for a fixed operating voltage, and/or have increased guard-bands between adjacent stored data states—any and all of which tend to improve performance.

FIGS. 2A-5A illustrate a series of perspective views that collectively depict an embodiment consistent with FIG. 1's methodology. FIGS. 2B-5B illustrate charts depicting size distributions for the perspective views of FIGS. 2A-5A, respectively. For example, FIG. 2B depicts a size distribution for FIG. 2A's perspective view; FIG. 3B depicts a size distribution for FIG. 3A's perspective view; and so on.

In FIG. 2A, a silicon substrate 200 with a first tunnel dielectric layer 202 is provided. In the embodiment illustrated and described below, the semiconductor substrate 200 is referred to as being a silicon substrate. However, the semiconductor substrate 200 in more general terms may be a bulk semiconductor (e.g., silicon) wafer, a binary compound substrate (e.g., a GaAs wafer), a ternary compound substrate (e.g., AlGaAs), or higher order compound wafers, among others. Further, semiconductor substrate 200 can also include non-semiconductor materials such as oxide in silicon-on-insulator (SOI), partial SOI substrate, polysilicon, amorphous silicon, or organic materials, among others. In some embodiments, the semiconductor substrate 200 can also include multiple wafers or dies which are stacked or otherwise adhered together. The semiconductor substrate 200 can include wafers which are cut from a silicon ingot, and/or any other type of semiconductor/non-semiconductor and/or deposited or grown (e.g., epitaxial) layers formed on an underlying substrate.

As shown in FIG. 2B, the surface of first tunnel dielectric layer 202 can be initially provided substantially free of silicon dot nucleates. In some embodiments, the first tunnel dielectric layer 202 is an oxide layer, such as $SiO_2$, having a thickness that is less than approximately 100 Angstroms thick.

In FIG. 3A, a layer of silicon dot nucleates 300 are formed on an upper surface of the tunnel dielectric 202. The silicon dot nucleates have respective initial sizes which differ from one another according to a first size distribution 350, as shown in FIG. 3B. Within this first size distribution 350, individual initial silicon dot nucleates, which are spherical or spherical-like in shape, have diameters ranging from approximately 3 nm to approximately 10 nm. Thus, a first silicon dot nucleate 302 can have a first diameter of approximately 10 nm, while a second, smaller silicon dot nucleate 304 can have a second diameter of approximately 4 nm or 5 nm. In particular, the illustrated first size distribution 350 shows the sizes of the silicon dot nucleates in layer 300 can be approximately Gaussian, with the greatest number of dots having a mean dot size 354, for example, a mean dot diameter of between approximately 6 nm and approximately 7 nm. The first size distribution 350 has a first spread 352, or sigma, of approximately 50%. Thus, if the mean dot diameter 354 is 6.5 nm; there are a significant number of other Si dots having dot diameters of (6.5 nm+/−50%*6.5 nm), or equivalently 3.25 nm or 9.75 nm.

In some embodiments, these silicon dot nucleates 300 of FIG. 3A can be formed in a low-pressure chemical vapor deposition (LPCVD) process. In some of these embodiments, a SiH4 or Si2H6 gas flow of less than 100 sccm, an Ar or N2 carrier gas rate of 20000 sccm, and a pressure of less than approximately 200 Torr. can be used during LPCVD processing. The time for this process depends on the pressure used, but can be less than 200 seconds in some embodiments.

At FIG. 4A, an etching process has been carried out to reduce the sizes of the initial silicon dot nucleates and to concurrently "tighten" their size distribution. Thus, the "small" Si dot nucleates (e.g., 304 from FIG. 3A) can be removed, with the other "larger" Si dot nucleates (e.g., 302 from FIG. 3A) can be reduced in size. For example, the size of the first silicon dot nucleate (302, FIG. 3A), which had a diameter of approximately 10 nm, can be reduced in size to provide reduced size silicon dot nucleate 402 having a diameter of approximately 5-6 nm; while the second, smaller silicon dot nucleate (304, FIG. 3A) can be completely removed from the surface of tunnel dielectric 202. After the etching process is completed, the sizes of the silicon dot nucleates differ from one another according to a second size distribution 450, as shown in FIG. 4B. This second size distribution 450 has a second spread 452, which is smaller than the first spread 352 of the first size distribution 350. In some embodiments, the second spread 452 is approximately 30% or less than the first spread 352. Thus, if the mean dot diameter 454 is 4.5 nm; there are a significant number of other Si dots having dot diameters of (4.5 nm+/−30%*4.5 nm), or equivalently between 3 nm and 6 nm. In still other embodiments, the second spread 452 can be approximately 20% or less than the first spread 352, meaning that if the mean dot diameter 454 is 4.5 nm; there are a significant number of other Si dots having dot diameters of (4.5 nm+/−20%*4.5 nm), or equivalently between 3.6 nm and 5.4 nm.

In some embodiments, the etching process utilized in FIG. 4A is an in-situ dry etch, such as a plasma etch, but this etching process can also be an ex-situ dry etch, such as a plasma etch. In some embodiments, the etching process can be formed in a LPCVD process. In some of these embodiments, a SiH4 or Si2H6 gas flow of less than 100 sccm, an Ar or N2 carrier gas rate of 20000 sccm, and a pressure of less than approximately 200 Torr. can be used during LPCVD processing. The time for this process depends on the pressure used, but can be less than 200 seconds in some embodiments.

In FIG. 5A, after the etching process has been performed, a growth process is performed to provide enlarged silicon dots 502 having respective enlarged sizes that are larger than the initial sizes. In some embodiments, this growth process occurs with formation of few or no additional silicon dot nucleates, but rather only enlarges the existing silicon dot nucleates. For example, in some embodiments, the enlarged silicon dots 502 have mean diameters of approximately 20 nm with individual diameters that range from approximately 16 nm to approximately 24 nm, with substantially zero silicon dots having diameters of less than 3 nm and substantially zero silicon dots have diameters of greater than 37 nm. This is shown in FIG. 5B, wherein which shows a third size distribution 550 for the enlarged silicon dots having a third spread 552 that is smaller than the first spread 352, and approximately equal to the second spread 452. The mean dot diameter 554 is increased relative to mean dot diameters 354, 454.

In some embodiments, the growth process utilized in FIG. 5A comprises flowing $Si_2H_6$ as a precursor gas at a flow rate of less than approximately 200 sccm and flowing He gas as a carrier gas at flow at less than 2000 sccm, then performing LPCVD at a pressure of less than 100 Torr and a temperature of less than 550° C. Other carrier precursor gases, precursor gases, pressures, and temperatures could also be used. For example, $SiH_6/Cl_2$ could also be used as a precursor gas with He carrier gas in other embodiments.

Figure 6:
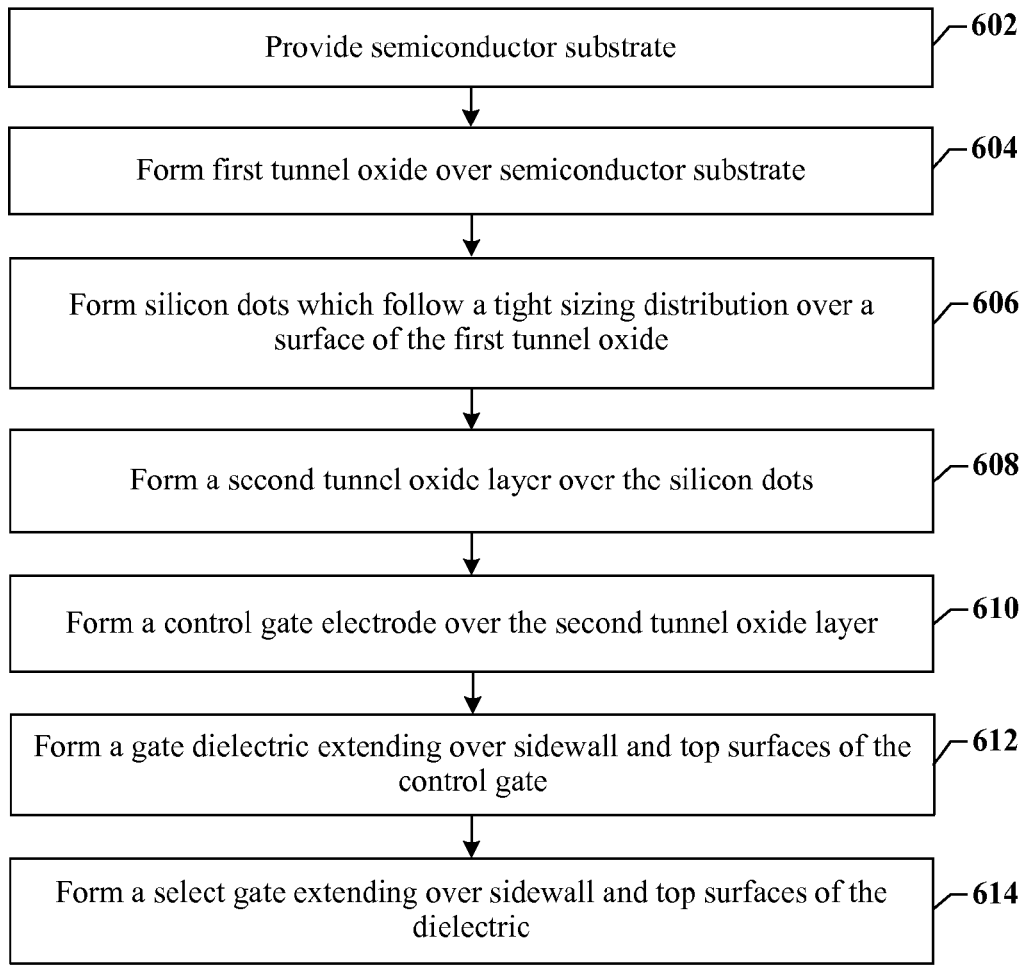
FIG. 6 illustrates a flow chart depicting a method of providing a charge trapping dielectric layer that includes Si dots in accordance with some embodiments.

FIGS. 6-22 shows some example methods of manufacturing flash memory devices that make use of silicon dots with improved size distribution. In particular, FIG. 6 shows a flow chart depicting a control gate first (select gate last) manufacturing flow, and FIGS. 7-14 show example cross-sectional views corresponding to FIG. 6's flow chart. FIG. 15 shows a flow chart depicting a select gate first (control gate last) manufacturing flow, and FIGS. 16-22 show example cross-sectional views corresponding to FIG. 15's flow chart. It will be appreciated that not all illustrated steps are necessarily required, and in other embodiments some of these steps may be omitted. Further, in other embodiments, additional process steps which are not illustrated herein may be present. Further still in other embodiments, the order of the illustrated processing steps can be re-arranged. All such embodiments are contemplated as falling with the scope of the present disclosure.

In FIG. 6, a semiconductor substrate is provided at 602. At 604, a first tunnel oxide is formed over the semiconductor substrate. At 606, silicon dots are formed over a surface of the first tunnel dielectric. These silicon dots can follow a tight uniform sizing distribution such as can be formed by the methodologies previously described in FIGS. 1-5. In 608, a second tunnel dielectric layer is formed over the silicon dots. In 610, a control gate electrode is formed over the second tunnel dielectric layer. In 612, a gate dielectric layer which extends over sidewall and top surfaces of the control gate is formed. In 614, a select gate which extends over sidewall and top surfaces of the dielectric is formed.

FIGS. 7-14 are now described below show a series of cross-sectional views consistent with the methodology of FIG. 6.

Figure 7:
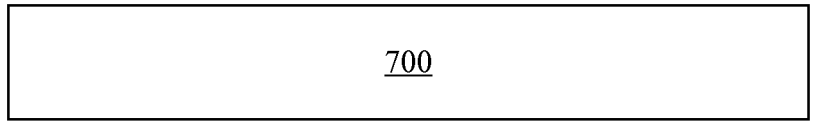
FIGS. 7-14 depict a series of cross-sectional views that collectively illustrate a method of providing a charge trapping layer that includes Si dots in accordance with some embodiments consistent with FIG. 6.

In FIG. 7, which corresponds to one example of 602 in FIG. 6, a semiconductor substrate 700 is provided.

Figure 8:
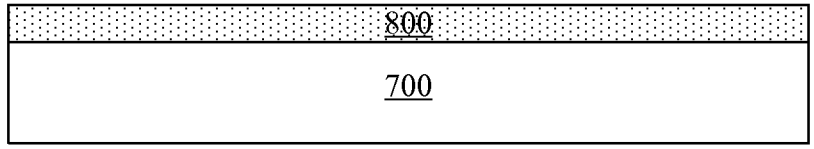

In FIG. 8, which corresponds to one example of 604 in FIG. 6, a first tunnel dielectric 800 is formed over the substrate 700. The first tunnel dielectric 800, which can be oxide such as $SiO_2$ in some embodiments, can be grown to a predetermined thickness such that the first tunnel dielectric 800 corresponds to an energetic tunnel barrier for electrons whereby electrons can quantum-mechanically tunnel from a channel region in the substrate 700 through the first tunnel dielectric 800 onto silicon dots to be formed over the first tunnel dielectric (or vice versa). For example, in some embodiments, the first tunnel dielectric 800 can be made of $SiO2$ having a predetermined thickness of less than 100 Angstroms.

Figure 9:
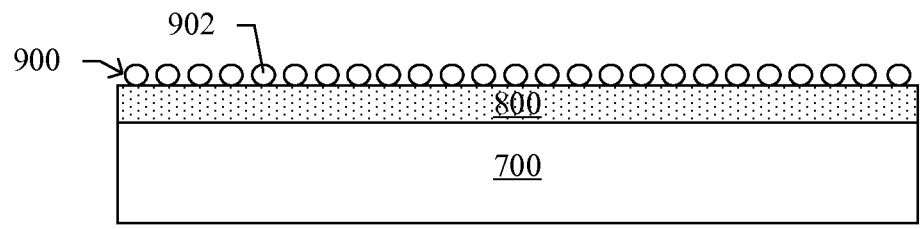

In FIG. 9, which corresponds to one example of 606 in FIG. 6, a layer of silicon dots 900 which follow a tight size distribution are formed over an upper surface of the first tunnel dielectric 800. In some embodiments, the acts previous described in FIG. 1 and/or the acts described in FIGS. 2-5 can be carried out in FIG. 9 to achieve this tight size distribution. Thus, for example, to form the layer of silicon dots 900, a layer of silicon dot nucleates can first be formed, after which an etching process can be performed to reduce the initial sizes of the silicon dot nucleates and concurrently tighten the size distribution of the nucleates. After the etching processing has taken place, a growth process can be performed to provide enlarged silicon dots 902 illustrated in FIG. 9. In some embodiments, the enlarged silicon dots 902 have diameters ranging from approximately 16 nm to approximately 24 nm. In some embodiments, such as the illustrated embodiment, the enlarged silicon dots 902 can be uniformly distributed so there are approximately equal spacings between neighboring silicon dots. However, in other embodiments, the enlarged silicon dots 902 can have different spacings there between. Further, the layer of silicon dots is not necessarily a single layer or mono-layer as illustrated, but can be made up of multiple layers of silicon dots that are stacked or "piled" on top of one another in a random or non-random manner.

Figure 10:
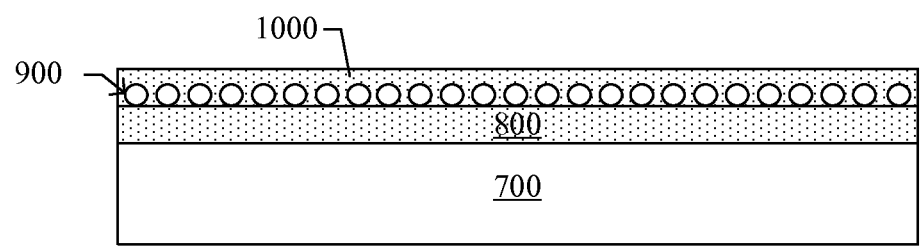

In FIG. 10, which corresponds to one example of 608 in FIG. 6, a second tunnel dielectric layer 1000 is formed over the layer of silicon dots 900. The second tunnel dielectric 1000, which can be oxide such as $SiO_2$ in some embodiments, can be grown to a predetermined thickness such that the second tunnel dielectric 1000 corresponds to an energetic tunnel barrier for electrons whereby electrons can quantum-mechanically tunnel from above the second tunnel dielectric 1000 onto the silicon dots 900 (or vice versa). In some embodiments, the second tunnel dielectric 1000 is the same thickness and material as the first tunnel dielectric 800, but the first and second tunnel dielectrics 800, 1000 could also be made of different materials and/or have different thicknesses.

Figure 11:
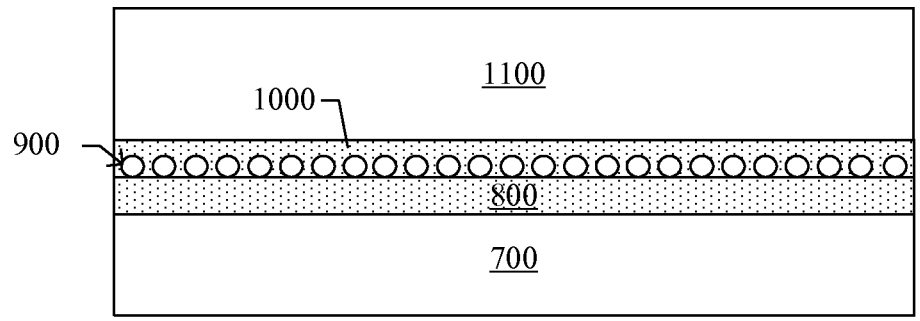

In FIG. 11, which corresponds to one example of 610 in FIG. 6, a first conductive layer 1100 is formed over the second tunnel dielectric layer 1000. In some embodiments, this first conductive layer 1100 is made of doped polysilicon, but the first conductive layer 1100 can also be a metal or metal alloy. Some examples of metal include tungsten (W), nickel (Ni), aluminum (Al), copper (Cu), gold (Au), silver (Ag), platinum (Pt), zinc (Zn), lead (Pb), tin (Sn), iron (Fe), titanium (Ti), and/or alloys of any of these metals, among others.

Figure 12:
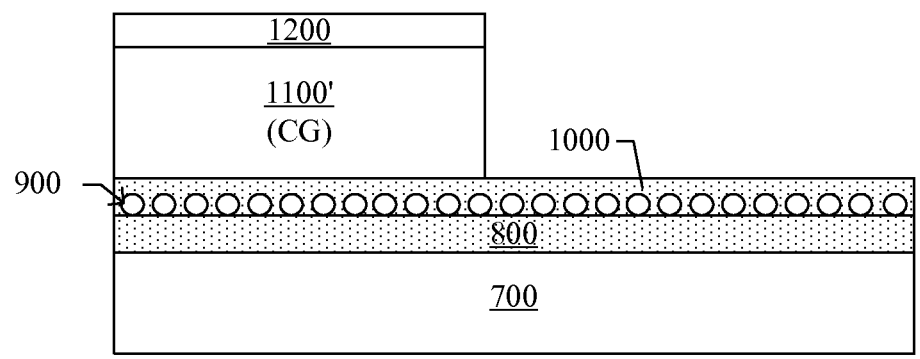

In FIG. 12, which corresponds to one example of 612 in FIG. 6, a mask 1200 is formed and patterned over the first conductive layer. Typically, this mask 1200 is formed by forming a layer of photoresist material over the first conductive layer, placing one or more photomasks over the layer of photoresist material, and exposing the layer of photoresist material to radiation that interacts with exposed portions of the layer of photoresist material. The photomask(s) are then taken away, and the layer of photoresist is developed to remove the exposed (or unexposed) portions of the layer of photoresist material, depending on whether positive or negative photoresist is used. In this way, a pattern from the photomask is transferred to the mask 1200. Other photolithographic techniques, such as e-beam lithography can also be used to pattern mask 1200. Although the mask 1200 can be a patterned layer of photoresist in some embodiments, in other embodiments the mask 1200 can be a hard mask, such as a nitride mask, an oxide mask, or some other type of mask, and can include multiple layers made of different materials. With the mask 1200 in place, an etch is carried out to transfer the pattern of the mask 1200 to the underlying conductive layer, thereby forming a control gate (CG) 1100'.

Figure 13:
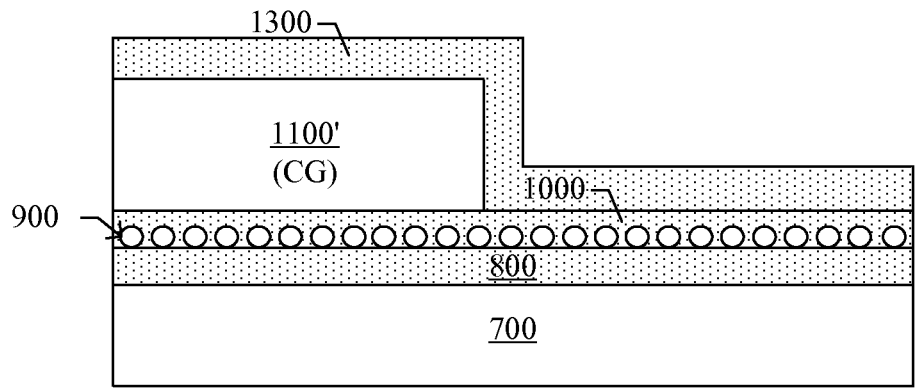

In FIG. 13, which corresponds to one example of 614 in FIG. 6, a gate dielectric layer 1300 is conformally formed over the control gate 1100'. In some embodiments, the gate dielectric layer 1300 is made of an oxide, such as silicon dioxide ($SiO_2$), which is thicker than the first and second tunnel dielectrics 800, 1000 to help limit leakage. An advantage of using SiO2 is its ease of integration into a wide variety of manufacturing flows. In other embodiments, however, the gate dielectric layer 1300 can be made of a high-k dielectric material which has a dielectric constant greater than that of $SiO_2$. An advantage of using a high-k dielectric material is that it can provide increased gate capacitance with limited or no leakage during normal memory operation, although high-k dielectric materials can be more challenging and/or expensive to integrate into manufacturing flows. Examples of high-k dielectric materials include, but are not limited to: hafnium silicate, zirconium silicate, hafnium dioxide, and zirconium dioxide, any of which can be typically deposited using atomic layer deposition (ALD) techniques, for example.

Figure 14:
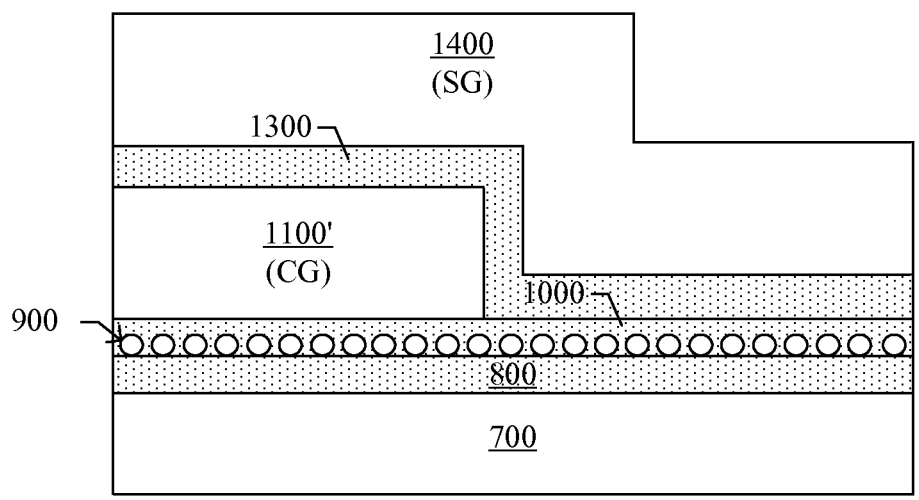
Figure 15:
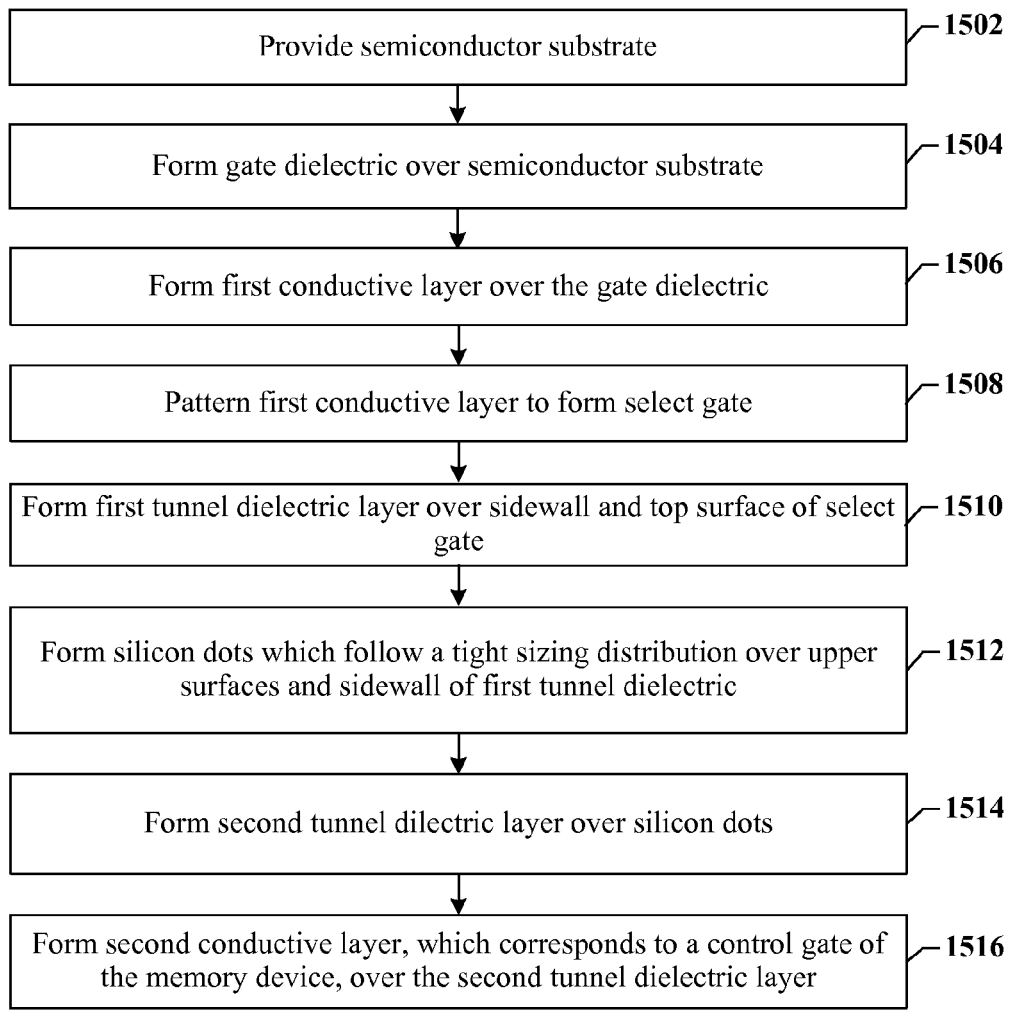
FIG. 15 illustrates a flow chart depicting a method of providing a charge trapping dielectric layer that includes Si dots in accordance with some embodiments.

In FIG. 14, which corresponds to one example of 616 in FIG. 6, a second conductive layer 1400 is formed over the gate dielectric layer 1300. In some embodiments, this second conductive layer 1400 is made of doped polysilicon, but the second conductive layer 1400 can also be a metal or metal alloy. Some examples of metal include tungsten (W), nickel (Ni), aluminum (Al), copper (Cu), gold (Au), silver (Ag), platinum (Pt), zinc (Zn), lead (Pb), tin (Sn), iron (Fe), titanium (Ti), and/or alloys of any of these metals, among others. The second conductive layer 1400 corresponds to a select gate (SG) of the memory device.

Turning now to FIG. 15, a flow chart depicting a select gate first (control gate last) manufacturing flow is illustrated. In FIG. 15, a semiconductor substrate is provided at 1502. At 1504, a gate dielectric is formed over the semiconductor substrate. At 1506, a first conductive layer is formed over the gate dielectric. At 1508, the first conductive layer is patterned to form a select gate. In 1510, a first tunnel dielectric is formed over the select gate. In 1512, a layer of silicon dots are formed over upper surfaces and sidewalls of the first tunnel dielectric. These silicon dots can follow a tight uniform sizing distribution such as can be formed by the methodologies previously described in FIGS. 1-5. In 1514, a second tunnel dielectric layer is formed over the silicon dots. In 1516, a control gate electrode is formed over the second tunnel dielectric layer.

FIGS. 16-22 are now described below show a series of cross-sectional views consistent with the methodology of FIG. 15.

Figures 16, 17:
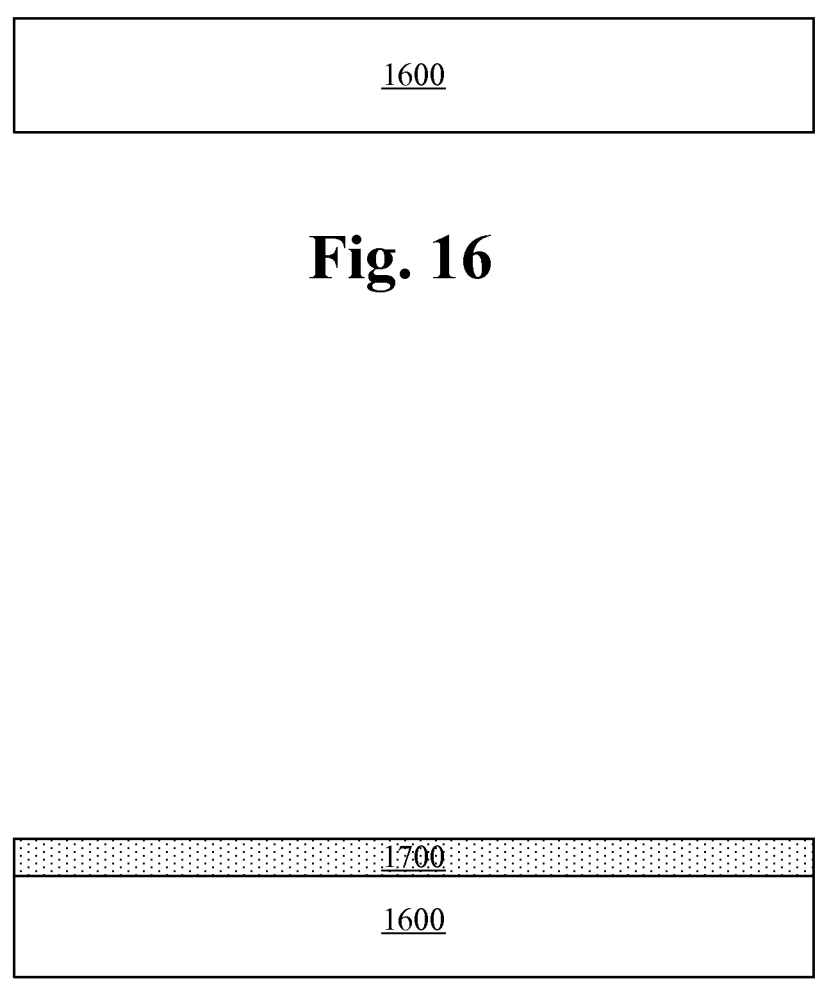

In FIG. 16, which corresponds to one example of 1502 in FIG. 15, a semiconductor substrate 1600 is provided.

In FIG. 17, which corresponds to one example of 1504 in FIG. 15, a gate dielectric layer 1700 is formed over the substrate 1600. In some embodiments, the gate dielectric layer 1700 is made of an oxide, such as silicon dioxide ($SiO_2$). In other embodiments, however, the gate dielectric layer 1700 can be made of a high-k dielectric material which has a dielectric constant greater than that of $SiO_2$.

Figure 18:
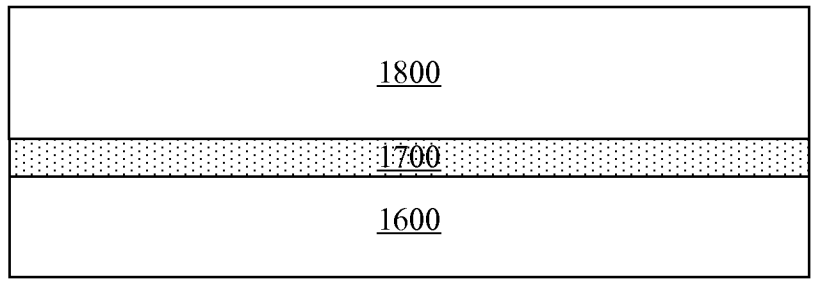

In FIG. 18, which corresponds to one example of 1506 in FIG. 15, a first conductive layer 1800 is formed over the gate dielectric layer 1700. In some embodiments, this first conductive layer 1800 made of doped polysilicon, but the first conductive layer 1800 can also be a metal or metal alloy. Some examples of metal include tungsten (W), nickel (Ni), aluminum (Al), copper (Cu), gold (Au), silver (Ag), platinum (Pt), zinc (Zn), lead (Pb), tin (Sn), iron (Fe), titanium (Ti), and/or alloys of any of these metals, among others.

Figure 19:
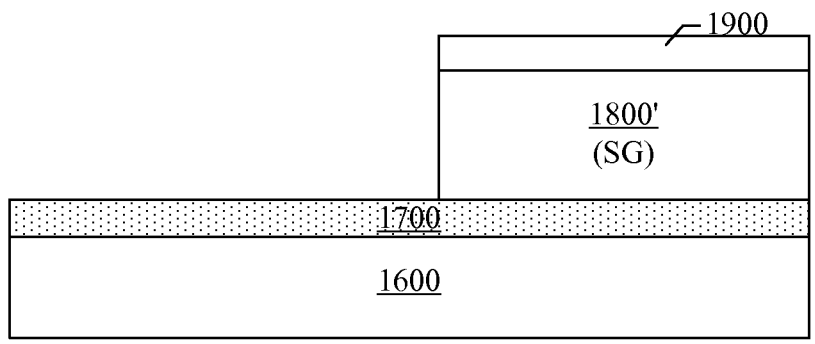

In FIG. 19, which corresponds to one example of 1508 in FIG. 15, a mask 1900 is formed and patterned over the first conductive layer. Typically, this mask 1900 is formed by forming a layer of photoresist material over the first conductive layer, placing one or more photomasks over the layer of photoresist material, exposing the layer of photoresist material to radiation that interacts with exposed portions of the layer of photoresist material. The photomask(s) are then taken away, and the layer of photoresist is developed to remove the exposed (or unexposed) portions of the layer of photoresist material, depending on whether positive or negative photoresist is used. In this way, a pattern from the photomask is transferred to the mask 1900. Other photolithographic techniques, such as e-beam lithography can also be used to pattern mask 1900. Although the mask 1900 can be a patterned layer of photoresist in some embodiments, in other embodiments the mask 1900 can be a hard mask, such as a nitride mask, an oxide mask, or some other type of mask, and can include multiple layers made of different materials. With the mask 1900 in place, an etch is carried out to transfer the pattern of the mask to the underlying first conductive layer, thereby forming a select gate (SG) 1800'.

Figure 20:
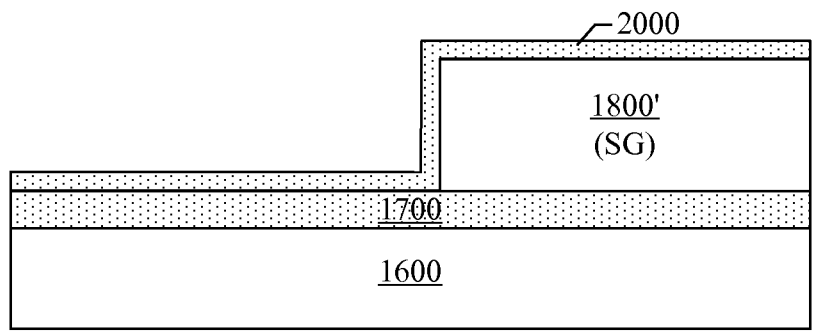

In FIG. 20, which corresponds to one example of 1510 in FIG. 15, a first tunnel dielectric 2000 is formed over the gate dielectric 1700 and SG 1800'. The first tunnel dielectric 2000, which can be oxide such as $SiO_2$ in some embodiments, can be grown to a predetermined thickness such that the first tunnel dielectric 2000 corresponds to an energetic tunnel barrier for electrons whereby electrons can quantum-mechanically tunnel from the SG 1800' to silicon dots to be formed over the first tunnel dielectric 2000 (or vice versa). The first tunnel dielectric 2000 is often thinner than the gate dielectric 1700, having a thickness of less than 100 Angstroms in some embodiments.

Figure 21:
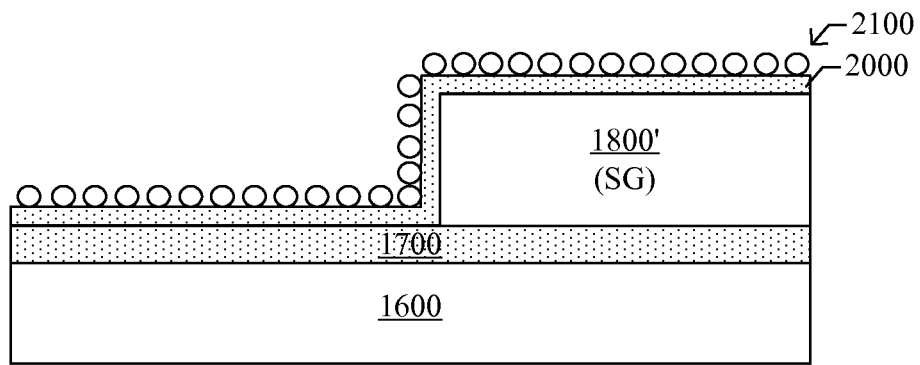

In FIG. 21, which corresponds to one example of 1512 in FIG. 15, a layer of silicon dots 2100 which follow a tight size distribution are formed over upper surfaces and sidewalls of the first tunnel dielectric 2000. In some embodiments, the acts previous described in FIG. 1 and/or the acts described in FIGS. 2-5 can be carried out in FIG. 21 to achieve this tight size distribution. Thus, for example, to form the layer of silicon dots in FIG. 21, a layer of silicon dot nucleates can first be formed, after which an etching process can be performed to reduce the initial sizes of the silicon dot nucleates and concurrently tighten the size distribution of the nucleates. After the etching processing has taken place, a growth process can be performed to provide enlarged silicon dots 2002 illustrated in FIG. 21. In some embodiments, the enlarged silicon dots 2002 have diameters ranging from approximately 16 nm to approximately 24 nm. In some embodiments, such as the illustrated embodiment, the enlarged silicon dots 2102 can be uniformly disbursed so there are approximately equal spacings between neighboring enlarged silicon dots, however, in other embodiments the enlarged silicon dots 2012 can have different spacings there between. Further, the layer of silicon dots 2100 is not necessarily a single layer or mono-layer as illustrated, but can be made up of multiple layers of silicon dots that are stacked or "piled" on top of one another in a random or non-random manner.

Figure 22:
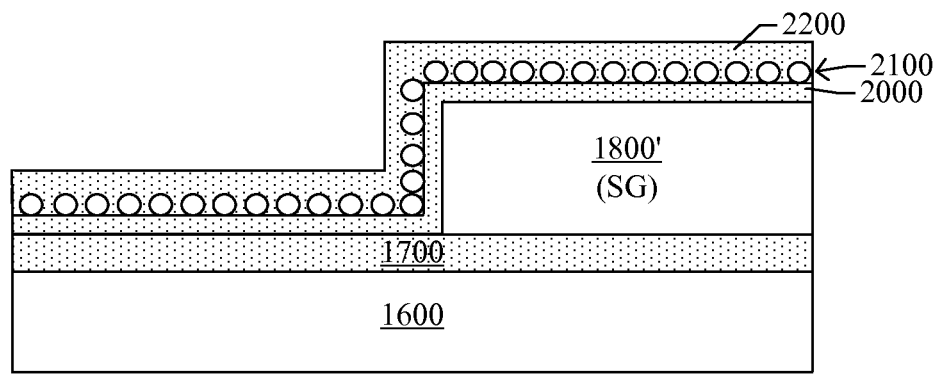

In FIG. 22, which corresponds to one example of 1514 in FIG. 15, a second tunnel dielectric layer 2200 is formed over the layer of silicon dots 2100. The second tunnel dielectric 2200, which can be oxide such as $SiO_2$ in some embodiments, can be grown to a predetermined thickness such that the second tunnel dielectric 2200 corresponds to an energetic tunnel barrier for electrons whereby electrons can quantum-mechanically tunnel from over the second tunnel dielectric 2200 onto the layer of silicon dots 2100 (or vice versa). In some embodiments, the second tunnel dielectric 2200 is the same thickness and material as the first tunnel dielectric 2000, but the first and second tunnel dielectrics 2000, 2200 could also be made of different materials and/or have different thicknesses.

Figure 23:
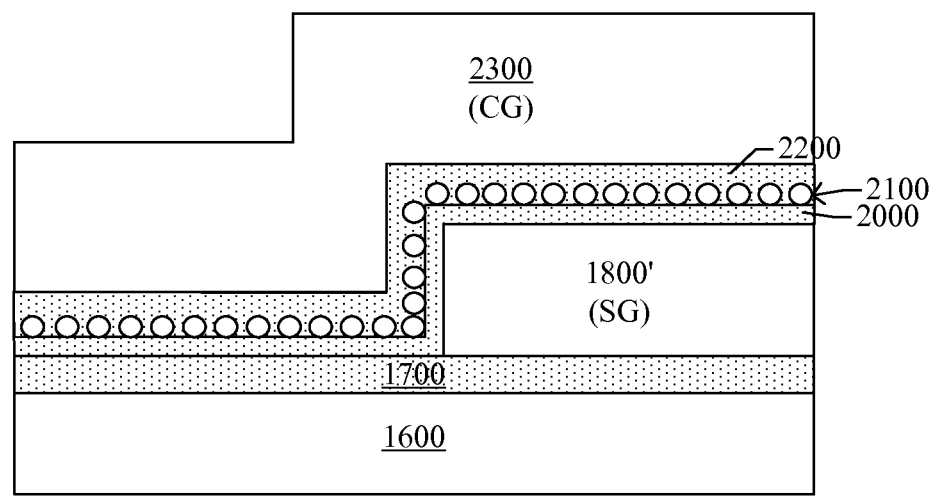

In FIG. 23, which corresponds to one example of 1516 in FIG. 15, a second layer of conductive material 2300 is formed over the second tunnel dielectric layer 2200. In some embodiments, this second conductive layer 2300 is made of doped polysilicon, but the second conductive layer 2300 can also be a metal or metal alloy. Some examples of metal include tungsten (W), nickel (Ni), aluminum (Al), copper (Cu), gold (Au), silver (Ag), platinum (Pt), zinc (Zn), lead (Pb), tin (Sn), iron (Fe), titanium (Ti), and/or alloys of any of these metals, among others. The second layer of conductive material 2300 corresponds to a control gate (CG) of the memory device.

Figure 24:
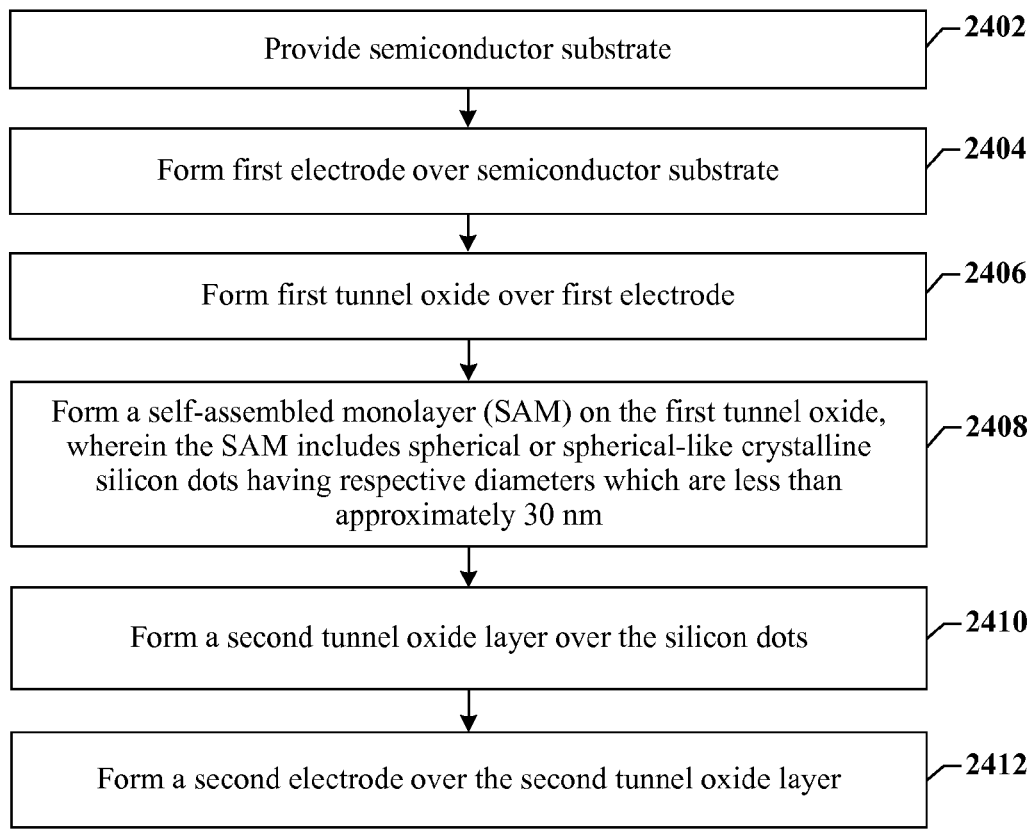
FIG. 24 illustrates a flow chart depicting a method of providing a charge trapping dielectric layer that includes Si dots in accordance with some embodiments.

FIG. 24 illustrates another method of forming conductive spherical or spherical-like crystalline dots having respective diameters which are less than approximately 30 nm. Rather than using etching techniques, this method 2400 utilizes self-assembled monolayers (SAM) techniques to form the dots. In some embodiments, these SAM techniques can be utilized in a control gate first (select gate last) manufacturing flow such as shown in FIG. 6's flowchart and/or the cross-sectional view of FIGS. 7-14. In other embodiments, these SAM techniques can be utilized in a select gate first (control gate last) manufacturing flow such as shown in FIG. 15 and/or the cross-sectional views of FIGS. 16-22. It will be appreciated that not all illustrated steps are necessarily required, and in other embodiments some of these steps may be omitted. Further, in other embodiments, additional process steps which are not illustrated herein may be present. Further still in other embodiments, the order of the illustrated processing steps can be re-arranged. All such embodiments are contemplated as falling with the scope of the present disclosure.

The method 2400 starts at 2402 wherein a semiconductor substrate is provided. In some instances, the semiconductor substrate is a silicon substrate. However, the semiconductor substrate in more general terms may be a bulk semiconductor (e.g., silicon) wafer, a binary compound substrate (e.g., a GaAs wafer), a ternary compound substrate (e.g., AlGaAs), or higher order compound wafers, among others. Further, semiconductor substrate can also include non-semiconductor materials such as oxide in silicon-on-insulator (SOI), partial SOI substrate, polysilicon, amorphous silicon, or organic materials, among others. In some embodiments, the semiconductor substrate 200 can also include multiple wafers or dies which are stacked or otherwise adhered together. The semiconductor substrate 200 can include wafers which are cut from a silicon ingot, and/or any other type of semiconductor/non-semiconductor and/or deposited or grown (e.g., epitaxial) layers formed on an underlying substrate.

In 2404, a first electrode is formed over the semiconductor substrate. In some embodiments, this first electrode is made of doped polysilicon, but the first electrode can also be a metal or metal alloy. Some examples of metal include tungsten (W), nickel (Ni), aluminum (Al), copper (Cu), gold (Au), silver (Ag), platinum (Pt), zinc (Zn), lead (Pb), tin (Sn), iron (Fe), titanium (Ti), and/or alloys of any of these metals, among others.

In 2406, a first tunnel dielectric layer can be formed over the first electrode. The surface of first tunnel dielectric layer can be initially provided substantially free of silicon dot nucleates. In some embodiments, the first tunnel dielectric layer is an oxide layer, such as $SiO_2$, having a thickness that is less than approximately 100 Angstroms thick.

In 2408, a self-assembled monolayer (SAM) is formed on the first tunnel oxide. In some embodiments, the SAM includes spherical or spherical-like crystalline silicon dots having respective diameters which are less than approximately 30 nm. The SAM can be formed by a combination of wet chemistry based on SiCl4 reduction. In one embodiment, the SAM is formed by carrying out a single in-situ synthesis using alkyltrichlorosilane, silicon tetrachloride and a reducing agent to simultaneously form alkyl-capped spherical or spherical-like crystalline silicon dots, wherein the reducing agent comprises LiAlH4, sodium napthalide, potassium napthalide, sodium naphthalenide, or potassium naphthalenide. In some embodiments, forming the SAM comprises carrying out a heterogeneous reaction with dispersions of alkali metals or zintl salts as reducing agents to form surface terminations of Si—Cl groups; and subsequently adding a long-chain alcohol to change the surface terminations from Si—Cl groups to Si—O—$(CH_2)_n$—$CH_3$ groups to form the spherical or spherical-like crystalline silicon dots. In other embodiments, forming the SAM comprises carrying out a homogeneous reaction using LiAlH4, sodium napthalide, potassium napthalide, sodium naphthalenide, or potassium naphthalenide to form surface terminations of Si—Cl groups; and subsequently adding a long-chain alcohol to change the surface terminations from Si—Cl groups to Si—O—$(CH_2)_n$—$CH_3$ groups to form the spherical or spherical-like crystalline silicon dots. In some embodiments, n in the formula Si—O—(CH2)n-CH3 is selected to correspond to a critical dimension between nearest edges of neighboring features on the flash memory made by the method. For example, if a larger critical spacing between features is desired, a longer chain (i.e., larger n) can be selected; whereas if a smaller critical spacing between features is desired, a shorter chain (i.e., smaller n) can be used.

In other embodiments, the SAM layer can be formed through the reduction of noble metal ions by ethanol, for example at a temperature of 20° C. to 200° C. under hydrothermal or atmospheric conditions. In some synthesis techniques, an aqueous solution containing metal salts (e.g., AgNO3, HAuCl4 or other soluble chlorides), sodium linoleate, ethanol and linoleic acid were added to an autoclave tube under agitation.

In still other embodiments, the SAM layer can be formed using a solution of monodisperse dodecanethiol-ligated gold nanocrystals in toluene, along with a small amount of dodecanethiol, provided as a droplet on the first tunnel oxide layer. The dodecanethiol can be added to be $5 \times 10^{-5}$ to $6 \times 10^{-3}$ of the total solution by volume. The droplet can then be evaporated at a rate of approximately 1 mg/min until a thin film of dodecanethiol remained. The remainder of the droplet is then evaporated over several hours. If the original drop was dispensed over the entire substrate, including over the entire flash device, the resultant monolayer can extend over the entire substrate. In contrast, if the original drop was limited in size to wet only over the flash memory, for example self-aligned due to wettability differences between the flash memory and the remainder of the substrate, the resultant monolayer can be formed solely over the flash devices. Differences in wettability can be achieved by using different exposed surface materials for the flash region and other substrate regions, or by performing a plasma treatment on the surface of the flash regions while leaving the non-flash regions covered (or vice versa).

In some instances, spherical or spherical-like crystalline silicon dots, when formed by SAM techniques have individual diameters that range from approximately 2 nm to approximately 3 nm; but in other embodiments, the silicon dots can have individual sizes between 3 nm and 6 nm. Sizes of spherical or spherical-like crystalline silicon dots have a collective size variance ranging from approximately 10% to approximately 20% of an average or mean silicon dot size for the flash memory. For example, if the average or mean size of silicon dots on the flash memory is 5 nm, some larger silicon dots can have sizes as large as 5.5 nm or even 6 nm, while some smaller silicon dots can have sizes as small as 4.5 nm or even 4 nm. Further, the spacings between respective centers of neighboring silicon dots have a collective spacing variance ranging from approximately 5% to approximately 15% of an average or mean spacing variance between neighboring silicon dots. In some embodiments, the spacings between respective centers of neighboring silicon dots range between approximately 2.5 nm and 3.5 nm.

In some embodiments, the conductive dots comprise crystalline silicon, however, in other embodiments, the conductive dots can be other materials, such as a noble metal, a magnetic material, a rare-earth fluorescent material, or an organic optoelectronic material for example.

In 2410, a second tunnel dielectric layer can be formed over the first electrode. In some embodiments, the second tunnel dielectric layer is an oxide layer, such as $SiO_2$, having a thickness that is less than approximately 200 Angstroms thick. Thus, in some embodiments, the second tunnel dielectric layer has a thickness that is greater than that of the first tunnel dielectric layer. For example, the first dielectric layer can be approximately 100 angstroms thick, while the second dielectric layer can have a thickness of approximately 200 angstroms thick. This can help to ensure the second tunnel dielectric provides adequate coverage and adequate electrical isolation between the conductive dots and the second electrode.

In 2412, the second electrode is formed over the second tunnel dielectric layer. In some embodiments, this second electrode is made of doped polysilicon, but the second electrode can also be a metal or metal alloy. Some examples of metal include tungsten (W), nickel (Ni), aluminum (Al), copper (Cu), gold (Au), silver (Ag), platinum (Pt), zinc (Zn), lead (Pb), tin (Sn), iron (Fe), titanium (Ti), and/or alloys of any of these metals, among others.

Thus, SAM formation techniques can yield conductive dots that have a tight size distribution and which have a tight spacing distribution. Compared to conventional techniques, these SAM techniques for flash memory provide improved memory characteristics, such as tighter Vt distributions and correspondingly tighter read/write data states, due to the more uniform dot sizes and spacings. Risk of current leakage and/or premature failure of the device may also be reduced.

Therefore, it will be appreciated that some aspects of the present disclosure relate to a method for forming flash memory, In this method, a first tunnel oxide is formed over a semiconductor substrate. A self-assembled monolayer (SAM) is formed on the first tunnel oxide. The SAM includes spherical or spherical-like crystalline silicon dots having respective diameters of less than approximately 30 nm. A second tunnel oxide is then formed over the SAM.

Other embodiments relate to a method for forming a flash memory. In this method, a first electrode is formed over a substrate. A first tunnel oxide is formed over the first electrode. A self-assembled monolayer (SAM) is formed on the first tunnel oxide. The SAM includes spherical or spherical-like crystalline conductive dots having respective diameters which are less than approximately 20 nm. A second tunnel oxide is formed over the SAM. A second electrode is formed over the second tunnel oxide, wherein the second electrode abuts the second tunnel oxide.

Other embodiments relate to a flash memory cell that includes a first tunnel dielectric layer disposed over a semiconductor substrate. A second tunnel dielectric layer is disposed over the first tunnel dielectric layer. A charge-trapping layer is arranged between the first and second tunnel dielectric layers. The charge-trapping layer includes a plurality of spherical or spherical-like conductive dots having respective diameters that are less than 10 nm. The conductive dots are made of a noble metal, a magnetic material, a rare-earth fluorescent material, or an organic optoelectronic material.

Still other embodiments, relate to a method for forming flash memory. In this method a tunnel oxide is formed over a semiconductor substrate. A layer of silicon dot nucleates are formed on the tunnel oxide, wherein the layer of silicon dots includes silicon dot nucleates having respective initial sizes which differ according to a first size distribution having a first spread. An etching process is used to reduce the initial sizes of the silicon dot nucleates so reduced-size silicon dot nucleates have respective reduced sizes which differ according to a second size distribution having a second spread that is smaller than the first spread. After the etching process has been performed, a growth process is performed to enlarge the reduced sizes of the reduced-size silicon dots so enlarged silicon dots have respective enlarged sizes that are larger than the initial sizes. A second tunnel oxide is formed over the enlarged silicon dots. The second tunnel oxide layer is thicker than the first tunnel oxide layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming flash memory, comprising:
   forming a first tunnel oxide over a semiconductor substrate;
   forming a self-assembled monolayer (SAM) on the first tunnel oxide, wherein the SAM includes spherical or spherical-like crystalline silicon dots having respective diameters of less than approximately 30 nm; and
   forming a second tunnel oxide over the SAM;
   wherein forming the SAM comprises:
     carrying out a heterogeneous reaction with dispersions of alkali metals or zintl salts as reducing agents to form surface terminations of Si—Cl groups; and subsequently adding a long-chain alcohol to change the surface terminations from Si—Cl groups to Si—O—(CH$_2$)$_n$—CH$_3$ groups to form the spherical or spherical-like crystalline silicon dots.

2. The method of claim 1, further comprising:
forming a first electrode over the semiconductor substrate prior to forming the first tunnel oxide, wherein the first electrode abuts the first tunnel oxide; and
forming a second electrode over the second tunnel oxide, wherein the second electrode abuts the second tunnel oxide.

3. The method of claim 1, wherein the spherical or spherical-like crystalline silicon dots have individual diameters that range from approximately 2 nm to approximately 3 nm.

4. The method of claim 1, wherein sizes of the spherical or spherical-like crystalline silicon dots have a collective size variance ranging from approximately 5% to approximately 20%.

5. The method of claim 1, wherein spacings between respective centers of neighboring spherical or spherical-like silicon dots have a collective spacing variance ranging from approximately 5% to approximately 15%.

6. The method of claim 1, wherein spacings between respective centers of neighboring spherical or spherical-like silicon dots ranges between approximately 2.5 nm and 3.5 nm.

7. The method of claim 1, wherein n in the formula Si—O—(CH2)n-CH3 is selected to correspond to a critical dimension between nearest edges of neighboring features on the flash memory made by the method.

8. The method of claim 1, wherein forming the SAM comprises:
carrying out a homogeneous reaction using LiAlH4, sodium napthalide, potassium napthalide, sodium naphthalenide, or potassium naphthalenide to form surface terminations of Si—Cl groups,
subsequently adding the long-chain alcohol to change the surface terminations from Si—Cl groups to Si—O—(CH$_2$)$_n$—CH$_3$ groups to form the spherical or spherical-like crystalline silicon dots.

9. The method of claim 8, wherein n in the formula Si—O—(CH2)n-CH3 is selected to correspond to a critical dimension between nearest edges of neighboring features on the flash memory made by the method.

10. The method of claim 1, wherein forming the SAM comprises:
carrying out a single in-situ synthesis using alkyltrichlorosilane, silicon tetrachloride and a reducing agent to simultaneously form alkyl-capped spherical or spherical-like crystalline silicon dots, wherein the reducing agent comprises LiAlH4, sodium napthalide, potassium napthalide, sodium naphthalenide, or potassium naphthalenide.

11. The method of claim 1, further comprising:
prior to forming the first tunnel oxide, forming a gate dielectric over the semiconductor substrate;
prior to forming the first tunnel oxide, forming a first electrode over the gate dielectric;
wherein the first tunnel oxide is formed after the first electrode has been formed and extends over an upper surface of the first electrode and along a sidewall of the first electrode.

12. The method of claim 11, wherein the spherical or spherical-like silicon dots are arranged over an upper surface of the first tunnel oxide and along a sidewall of the first oxide, and wherein the second tunnel oxide covers the spherical or spherical-like silicon dots.

13. The method of claim 12, further comprising:
forming a second electrode over the second tunnel oxide, wherein the second electrode abuts an upper surface of the second tunnel oxide.

14. The method of claim 1, wherein the SAM includes silicon dot nucleates having respective initial sizes which differ according to a first size distribution having a first spread; and
performing an etching process to reduce the initial sizes of the silicon dot nucleates so reduced-size silicon dot nucleates have respective reduced sizes which differ according to a second size distribution having a second spread that is smaller than the first spread.

15. The method of claim 14, further comprising:
after the etching process has been performed, performing a growth process to enlarge the reduced sizes of the reduced-size silicon dot nucleates so enlarged silicon dots have respective enlarged sizes that are larger than the initial sizes.

16. A method for forming a flash memory, comprising:
forming a first electrode over a substrate;
forming a first tunnel oxide over the first electrode;
forming a layer of silicon dot nucleates on the first tunnel oxide, wherein the layer of silicon dots includes silicon dot nucleates having respective initial sizes which differ according to a first size distribution having a first spread;
performing an etching process to reduce the initial sizes of the silicon dot nucleates so reduced-size silicon dot nucleates have respective reduced sizes which differ according to a second size distribution having a second spread that is smaller than the first spread;
after the etching process has been performed, performing a growth process to enlarge the reduced sizes of the reduced-size silicon dot nucleates so enlarged silicon dots have respective enlarged sizes that are larger than the initial sizes;
forming a second tunnel oxide over the layer of silicon dot nucleates by carrying out a heterogeneous reaction with dispersions of alkali metals or zintl salts as reducing agents to form surface terminations of Si—Cl groups; and
forming a second electrode over the second tunnel oxide, wherein the second electrode abuts the second tunnel oxide.

17. The method of claim 16, wherein, due to a wettability difference between a flash memory region and non-flash memory regions on the substrate, the layer of silicon dot nucleates is self-aligned over the flash memory region and does not extend over the non-flash memory regions.

18. The method of claim 16, wherein the layer of silicon dot nucleates includes spherical or spherical-like crystalline silicon dots that have individual diameters that range from approximately 2 nm to approximately 3 nm.

19. The method of claim 16, wherein the layer of silicon dot nucleates includes spherical or spherical-like crystalline silicon dots, and sizes of the spherical or spherical-like crystalline silicon dots have a collective size variance ranging from approximately 5% to approximately 20%.

20. The method of claim 16, wherein the layer of silicon dot nucleates includes spherical or spherical-like crystalline silicon dots, and spacings between respective centers of neighboring spherical or spherical-like silicon dots have a collective spacing variance ranging from approximately 5% to approximately 15%.

21. The method of claim 16, wherein the layer of silicon dot nucleates includes spherical or spherical-like crystalline silicon dots, and spacings between respective centers of neighboring spherical or spherical-like silicon dots ranges between approximately 2.5 nm and 3.5 nm.

22. A method for forming flash memory, comprising:
forming a first tunnel oxide over a semiconductor substrate;
forming a layer of silicon dot nucleates on the first tunnel oxide, wherein the layer of silicon dots includes silicon dot nucleates having respective initial sizes which differ according to a first size distribution having a first spread;
performing an etching process to reduce the initial sizes of the silicon dot nucleates so reduced-size silicon dot nucleates have respective reduced sizes which differ according to a second size distribution having a second spread that is smaller than the first spread;
after the etching process has been performed, performing a growth process to enlarge the reduced sizes of the reduced-size silicon dot nucleates so enlarged silicon dots have respective enlarged sizes that are larger than the initial sizes, where the enlarged silicon dots have a third size distribution having a third spread that is smaller than the first spread; and
forming a second tunnel oxide over the enlarged silicon dots, wherein the second tunnel oxide is thicker than the first tunnel oxide.

23. The method of claim 22, wherein the enlarged silicon dots have respective diameters of less than approximately 30 nm.

* * * * *